(12) United States Patent
Gizinski et al.

(10) Patent No.: US 11,892,519 B2
(45) Date of Patent: Feb. 6, 2024

(54) SINUSOIDAL STIMULUS RESPONSE FOR INPUT POWER HEALTH DIAGNOSTIC

(71) Applicant: Steering Solutions IP Holding Corporation, Saginaw, MI (US)

(72) Inventors: Nicholas E. Gizinski, Essexville, MI (US); Julie A. Kleinau, Bay City, MI (US); David M. Williams, Millington, MI (US); Clayton D. Larson, Midland, MI (US); Steven J. Collier-Hallman, Frankenmuth, MI (US); Ashish Verma, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 0 days.

(21) Appl. No.: 17/733,434

(22) Filed: Apr. 29, 2022

(65) Prior Publication Data

US 2023/0349983 A1 Nov. 2, 2023

(51) Int. Cl.
| | | |
|---|---|---|
| *G01R 31/40* | (2020.01) | |
| *H02P 6/04* | (2016.01) | |
| *G01R 31/392* | (2019.01) | |
| *B62D 5/04* | (2006.01) | |

(52) U.S. Cl.
CPC .............. *G01R 31/40* (2013.01); *B62D 5/046* (2013.01); *G01R 31/392* (2019.01); *H02P 6/04* (2013.01)

(58) Field of Classification Search
None
See application file for complete search history.

(56) References Cited

U.S. PATENT DOCUMENTS

| | | | |
|---|---|---|---|
| 8,810,255 B2 | 8/2014 | Williams et al. | |
| 10,348,236 B2 | 7/2019 | Lin et al. | |
| 2005/0248301 A1* | 11/2005 | Trifilo | H02P 23/0004 318/268 |
| 2013/0229156 A1* | 9/2013 | Brandon | B60L 3/0046 320/136 |
| 2019/0131893 A1* | 5/2019 | Kawazu | B60W 10/08 |
| 2022/0169307 A1 | 6/2022 | Kleinau et al. | |

* cited by examiner

*Primary Examiner* — Jas A Sanghera
(74) *Attorney, Agent, or Firm* — Dickinson Wright PLLC

(57) ABSTRACT

Technical solutions are described for diagnosing an input power supply providing power to a motor. A method includes: generating a sinusoidal stimulus signal; applying, using the input power supply, the sinusoidal stimulus signal to the motor; measuring a response to the sinusoidal stimulus signal; determining a degraded condition of the input power supply based on the response to the sinusoidal stimulus signal; and performing an action in response to determining the degraded condition of the input power supply.

20 Claims, 9 Drawing Sheets

SINUSOIDAL STIMULUS RESPONSE FOR INPUT POWER HEALTH DIAGNOSTIC

BACKGROUND

A vehicle, such as a car, truck, sport utility vehicle, crossover, mini-van, marine craft, aircraft, all-terrain vehicle, recreational vehicle, or other suitable vehicles, typically includes one or more electric machines, such as electric motors and the like. For example, the vehicle may include one or more motors configured to control various aspects of a steering system of the vehicle.

A high power electrical harness and connector may supply electrical power from a vehicle electrical system (e.g. battery and/or alternator) to a motor controller for one or more motors of the steering system.

Over the life of the vehicle, the high power connection properties may degrade, resulting in eventual loss of input power sufficient to deliver the desired electromechanical output power to provide the steering assist or steering angle function. This degradation is observable as an effective increase in the resistance of the power connector or harness. When attempting to deliver this electromechanical output power, the supply current draw through the increased resistance of the high power connection or harness will cause a large voltage drop between the vehicle supply and the motor controller, which may cause the total voltage at the motor controller input to be low enough to result in a "turn off" or "drop from operate state", which may result in loss of function, such as loss of assist in an electric power steering (EPS) system, and/or loss of angle control in an advanced driver-assistance system (ADAS) or steer-by-wire (SbW) system.

SUMMARY

An aspect of the disclosed embodiments includes a method for diagnosing an input power supply providing power to a motor. The method includes: generating a sinusoidal stimulus signal; applying, using the input power supply, the sinusoidal stimulus signal to the motor; measuring a response to the sinusoidal stimulus signal; determining a degraded condition of the input power supply based on the response to the sinusoidal stimulus signal; and performing an action in response to determining the degraded condition of the input power supply.

Another aspect of the disclosed embodiments includes a method for diagnosing an input power supply providing power to a motor. The method includes: generating a stimulus signal having a stimulus magnitude; applying, using the input power supply, the stimulus signal to the motor; measuring a response to the stimulus signal; determining a degraded condition of the input power supply based on the response to the stimulus signal; and performing an action in response to determining the degraded condition of the input power supply. The degraded condition of the input power supply includes a harness resistance value, and generating the stimulus signal includes determining the stimulus magnitude based on an estimate of the harness resistance value.

Another aspect of the disclosed embodiments includes a system for diagnosing an input power supply providing power to a motor in a vehicle. The system includes a processor. The memory includes instructions that, when executed by the processor, cause the processor to: generate a sinusoidal stimulus signal; apply, using the input power supply, the sinusoidal stimulus signal to the motor; measure a response to the sinusoidal stimulus signal; determine a degraded condition of the input power supply based on the response to the sinusoidal stimulus signal; and perform an action in response to determining a degraded condition of the input power supply.

These and other aspects of the present disclosure are disclosed in the following detailed description of the embodiments, the appended claims, and the accompanying figures.

BRIEF DESCRIPTION OF THE DRAWINGS

The subject matter of the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
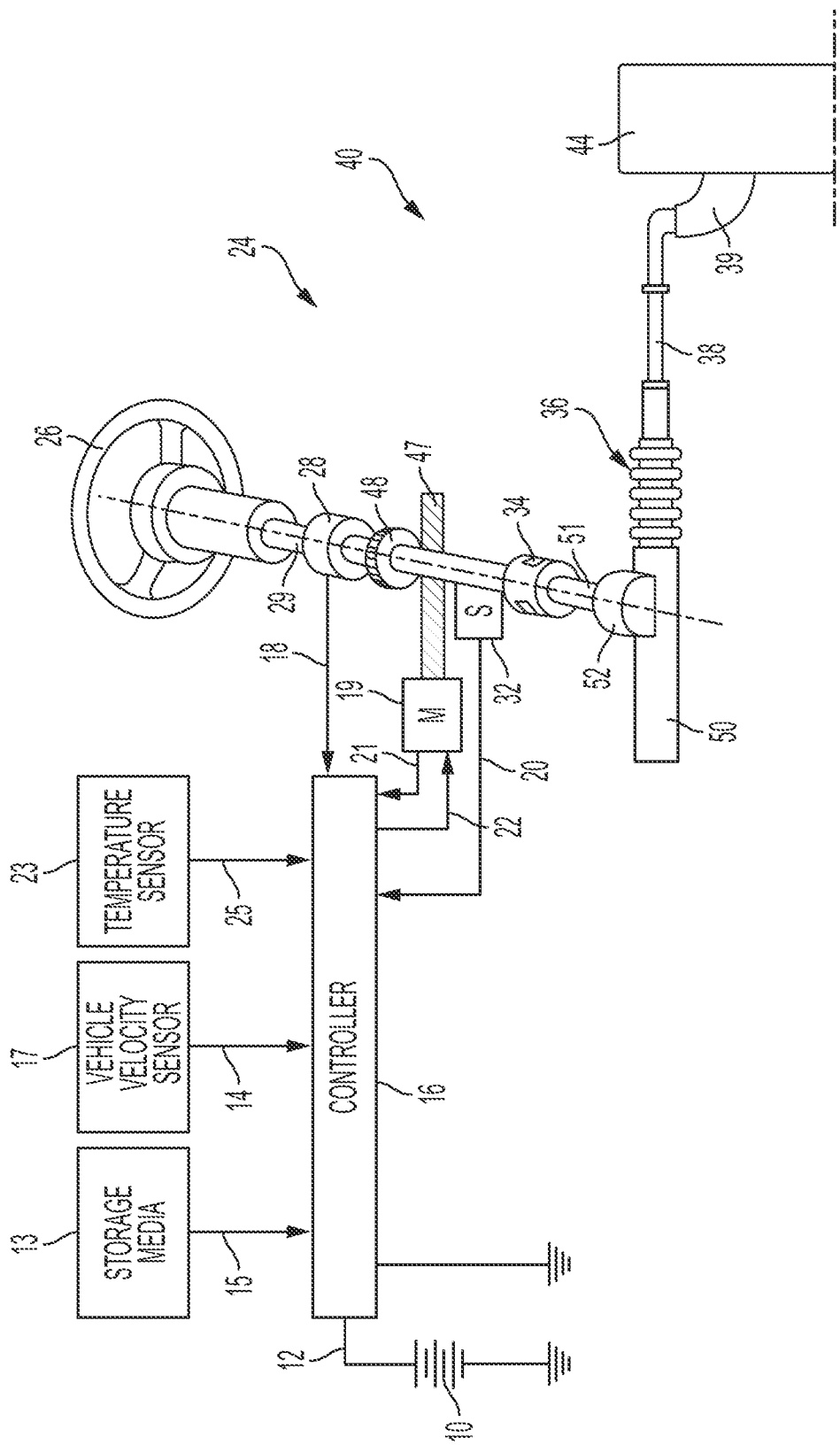
FIG. 1 generally illustrates an electronic power steering system according to the principles of the present disclosure.

Referring now to the figures, where the present disclosure will be described with reference to specific embodiments, without limiting the same, it is to be understood that the disclosed embodiments are merely illustrative of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

As described, a vehicle, such as a car, truck, sport utility vehicle, crossover, mini-van, marine craft, aircraft, all-terrain vehicle, recreational vehicle, or other suitable vehicles, typically includes one or more electric machines, such as electric motors and the like. For example, the vehicle may include one or more motors configured to control various aspects of a steering system of the vehicle.

A high power electrical harness and connector may supply electrical power from a vehicle electrical system (e.g. battery and/or alternator) to a motor controller for one or more motors of the steering system.

Over the life of the vehicle, the high power connection properties may degrade, resulting in eventual loss of input power sufficient to deliver the desired electromechanical output power to provide the steering assist or steering angle function. This degradation is observable as an effective increase in the resistance of the power connector or harness. When attempting to deliver this electromechanical output power, the supply current draw through the increased resistance of the high power connection or harness will cause a large voltage drop between the vehicle supply and the motor controller, which may cause the total voltage at the motor controller input to be low enough to result in a "turn off" or "drop from operate state", which may result in loss of function, such as Loss of Assist in an electric power steering (EPS) system, and/or loss of angle control in an advanced driver-assistance system (ADAS) or steer-by-wire (SbW) system.

A vehicle system, such as an EPS system, ADAS, SbW steering system, and the like, may deliver mechanical power through use of an electromechanical actuator which includes an electric motor and a control module. Input power for the actuator is delivered through a high power electrical harness and connector which connects the vehicle electrical system (e.g. battery and/or alternator) to the EPS Control Module.

Over the life of the steering system in the vehicle the high power connection properties may degrade, resulting in eventual loss of input power sufficient to deliver the desired electromechanical output power to provide the steering assist or steering angle function. This degradation is observable as an effective increase in the resistance of the power connector or harness. When attempting to deliver this electromechanical output power the supply current draw through the increased resistance of the high power connection (or harness) will cause a large voltage drop between the vehicle supply and the EPS Control Module which may cause the total voltage at the Control Module input to be low enough to result in a "turn off" or "drop from operate state" of the steering controller resulting in loss of function (loss of assist in an EPS system, loss of angle control in an ADAS or SbW system).

In some embodiments, it is desirable to detect this degraded condition. In some embodiments, it may also be desirable to limit an electromechanical output power command based on detecting this degraded condition in order to reduce the required input power and prevent loss of function of the steering system, such as loss of assist in an EPS system, or loss of angle control in an ADAS or SbW system). While performance may be reduced, this may be preferable to alternatives, which could include a full loss of the assist or angle control function.

Run time diagnostics may be used to monitor a status of the connection health. However, such run time diagnostics may require additional sensor signals (such as a battery current measurement circuit) or vehicle signals not readily available within the EPS/SbW systems (e.g. battery voltage). Run time diagnosis also may require significant processor resources. Run time diagnostics may also require a significant non-zero motor torque in order to work properly.

In some embodiments, it is desirable to have a method to determine degradation of the input power connection (or harness) using only available signals within the existing control module and software. It is desirable to have the possibility to detect this condition in a zero motor torque condition at start up. It is desirable to have a response where the power management function of the steering system limits the output power in order to limit the input power drawn during this condition with the purpose of preventing a large enough supply voltage drop which would turn the EPS/SbW Control module off, resulting in loss of function. It is desirable to have some form of driver warning, whether through the reduced performance or a fault code and possibly fault lamp.

In some embodiments, a startup diagnostic for electric power steering input power health function of the present disclosure has the following properties: it may be run as a one-time start up diagnostic; and it may operate on a stimulus/response measurement/action philosophy.

For an EPS system: electric power is applied to the motor phases and the response is measured. The power applied is V*I (vector quantities of applied motor voltage and motor current). The electric power applied is of a nature to produce zero motor torque. The measurement of the response is the voltage at the control module input (bridge voltage). The action is the application of a output power limit and driver notification if the metric calculated from the measurement exceeds a given threshold or thresholds.

For ADAS and SbW systems: electric power is applied to the motor phases and the response(s) are measured. The electric power applied is not necessarily of a zero torque nature. If the electric power applied is intended to measure the input power health only, electric power which results in zero torque is applied and the measurement of the response is the voltage at the control module input (bridge voltage). If there is an additional desire to check for mechanical connection robustness or power electronic health at the same time then electric power which results in non-zero motor torque is applied and the measurement of the response includes motor shaft angle in addition to bridge voltage. The action if the metric(s) calculated from the measurement exceed defined threshold(s) may include an output power limit, driver notification, and if the motor moves incorrectly the action could prevent the vehicle from moving.

In some embodiments, the diagnostic utilizes the property of PMSM (Permanent Magnet Synchronous Machines—SPM) where a motor current may be commanded on the direct axis only (Id), with a zero motor current command on the quadrature axis (Iq) which does not produce motor torque and therefore should not produce handwheel motion. In some embodiments, a non-zero Iq stimulus may be used, for example, if an output torque or motion is desired. This may be especially desirable in an ADAS or SbW system. Any combination of Iq and Id deemed desirable for the system of interest is within the scope of the present disclosure.

In some embodiments, the diagnostic uses existing signals available in a steering control system, such as an EPS or SbW system.

In some embodiments, a startup diagnostic includes: application of a stimulus, detection of a response, and taking an action. The stimulus may include applying electrical power to the motor. The action may be dependent of the requirements of a given product line or system architecture. The present disclosure provides for the use of a motor to apply non-torque producing current to elicit a measurable response, which may be imperceptible by a driver). In some embodiments, the subject diagnostic works in zero-torque condition. In some embodiments, the subject diagnostic does not require battery current measurement circuit or vehicle battery voltage. In some embodiments, the subject diagnostic includes the use of a power management supply current limit interface to respond to a health metric and to limit output power, not just assist torque.

Referring now to the figures, where the technical solutions will be described with reference to specific embodiments, without limiting same, FIG. 1 generally illustrates an electric power steering system (EPS) 40 according to the principles of the present disclosure. A steering mechanism 36 includes a rack-and-pinion type system and includes a toothed rack (not shown) within housing 50 and a pinion gear (also not shown) located under gear housing 52. As the operator input, hereinafter denoted as a steering wheel 26 (e.g. a hand wheel and the like) is turned, the upper steering shaft 29 turns and the lower steering shaft 51, connected to the upper steering shaft 29 through universal joint 34, turns the pinion gear. Rotation of the pinion gear moves the rack, which moves tie rods 38 (only one shown) in turn moving the steering knuckles 39 (only one shown), which turn a steerable wheel(s) 44 (only one shown).

Steering assist is provided through the control system generally designated by reference numeral 24 and includes the controller 16 and an electric machine, which includes a permanent magnet synchronous motor, and is hereinafter denoted as motor 19. The controller 16 is powered by the vehicle power supply 10 through a wiring harness 12. The wiring harness 12 may include one or more conductors, such as lengths of wire, bus bars, etc. In some embodiments, the wiring harness 12 includes one or more connectors, such as spade connectors, receptacles, plugs, lugs, wiring terminals, etc. The controller 16 receives a vehicle speed signal 14 representative of the vehicle velocity from a vehicle velocity sensor 17. Steering angle is measured through position sensor 32, which may be an optical encoding type sensor, variable resistance type sensor, or any other suitable type of position sensor, and supplies to the controller 16 a position signal 20. Motor velocity may be measured with a tachometer, or any other device, and transmitted to controller 16 as a motor velocity signal 21. A motor velocity denoted $\omega\_m$ may be measured, calculated or a combination thereof. For example, the motor velocity $\omega\_m$ may be calculated as the change of the motor position $\theta$ as measured by a position sensor 32 over a prescribed time interval. For example, motor velocity $\omega\_m$ may be determined as the derivative of the motor position $\theta$ from the equation $\omega\_m = \Delta\theta/\Delta t$ where $\Delta t$ is the sampling time and $\Delta\theta$ is the change in position during the sampling interval. Alternatively, motor velocity may be derived from motor position as the time rate of change of position. It will be appreciated that there are numerous well-known methodologies for performing the function of a derivative.

As the steering wheel 26 is turned, torque sensor 28 senses the torque applied to the steering wheel 26 by the vehicle operator. The torque sensor 28 may include a torsion bar (not shown) and a non-contacting magnetic torque sensor (also not shown), which outputs a variable torque signal 18 to controller 16 in relation to the amount of twist on the torsion bar. Although this is one type of torque sensor, any other suitable torque-sensing device used with known signal processing techniques will suffice. In response to the various inputs, the controller 16 sends a command 22 to the motor 19, which supplies torque assist to the steering system through worm 47 and worm gear 48, providing torque assist to the vehicle steering.

It should be noted that although the disclosed embodiments are described by way of reference to motor control for electric steering applications, it will be appreciated that such references are illustrative only and the disclosed embodiments may be applied to any motor control application employing an electric motor, e.g., steering, valve control, and the like. Moreover, the references and descriptions herein may apply to many forms of parameter sensors, including, but not limited to torque, position, speed and the like. It should also be noted that reference herein to electric machines including, but not limited to, motors, hereafter, for brevity and simplicity, reference will be made to motors only without limitation.

In the control system 24 as depicted, the controller 16 utilizes the torque, position, and speed, and like, to compute a command(s) to deliver the required output power. The control system 24 may provide, for example, EPS, SbW, and/or steering control for ADAS applications. Controller 16 is disposed in communication with the various systems and sensors of the motor control system. Controller 16 receives signals from each of the system sensors, quantifies the received information, and provides an output command signal(s) in response thereto, in this instance, for example, to the motor 19. Controller 16 is configured to develop the corresponding voltage(s) by an inverter (not shown on FIG. 1), which may optionally be incorporated with controller 16 and will be referred to herein as controller 16, such that, when applied to the motor 19, the desired torque or position is generated. In one or more examples, the controller 16 operates in a feedback control mode, as a current regulator, to generate the command 22. Alternatively, in one or more examples, the controller 16 operates in a feedforward control mode to generate the command 22. Because these voltages are related to the position and speed of the motor 19 and the desired torque, the position and/or speed of the rotor and the torque applied by an operator are determined. A position sensor is connected to the steering shaft 51 to detect the angular position $\theta$. The position sensor may sense the rotary position based on optical detection, magnetic field variations, or other methodologies. Typical position sensors include potentiometers, resolvers, synchros, encoders, and the like, as well as combinations comprising at least one of the forgoing. The position sensor outputs a position signal 20 indicating the angular position of the steering shaft 51 and thereby, that of the motor 19.

Desired torque may be determined by one or more torque sensors 28 transmitting torque signals 18 indicative of an applied torque. One or more exemplary embodiments include such a torque sensor 28 and the torque signal(s) 18 therefrom, as may be responsive to a compliant torsion bar, T-bar, spring, or similar apparatus (not shown) configured to provide a response indicative of the torque applied.

In one or more examples, a temperature sensor 23 is located at the motor 19. The temperature sensor 23 may be configured to directly measure a temperature of the sensing portion of the motor 19. The temperature sensor 23 transmits a temperature signal 25 to the controller 16 to facilitate the processing prescribed herein and compensation. Typical temperature sensors include thermocouples, thermistors, thermostats, and the like, as well as combinations comprising at least one of the foregoing sensors, which when appropriately placed provide a calibratable signal proportional to the particular temperature.

The position signal 20, velocity signal 21, and a torque signal(s) 18 among others, are applied to the controller 16. The controller 16 processes all input signals to generate values corresponding to each of the signals resulting in a rotor position value, a motor velocity value, and a torque value being available for the processing in the algorithms as prescribed herein. Measurement signals, such as the above mentioned are also commonly linearized, compensated, and filtered as desired to enhance the characteristics or eliminate undesirable characteristics of the acquired signal. For example, the signals may be linearized to improve processing speed, or to address a large dynamic range of the signal. In addition, frequency or time-based compensation and filtering may be employed to eliminate noise or avoid undesirable spectral characteristics.

In order to perform the prescribed functions and desired processing, as well as the computations therefore (e.g., the identification of motor parameters, control algorithm(s), and the like), controller 16 may include, but not be limited to, a processor(s), computer(s), DSP(s), memory, storage, register(s), timing, interrupt(s), communication interface(s), and input/output signal interfaces, and the like, as well as combinations comprising at least one of the foregoing. For example, controller 16 may include input signal processing and filtering to enable accurate sampling and conversion or acquisitions of such signals from communications interfaces.

In some embodiments, a vehicle may include a driver-assistance system (ADAS) or steer-by-wire (SbW) system, which may be similar or identical to the EPS 40, as described and as shown in FIG. 1. In some embodiments, such an ADAS or SbW system may include no steering wheel 26 or a steering wheel 26 with no physical connection to the steerable wheel(s) 44. In some embodiments, a feedback actuator (not shown) may provide a feedback torque to the steering wheel 26 to simulate feeling of torque being transmitted from the steerable wheel(s) 44. In some embodiments, an ADAS or SbW system may be operated in some modes where torque is applied by the motor 19 to the steerable wheel(s) 44, and where no corresponding feedback signal is generated or transmitted to the steering wheel 26.

Electrical power steering (EPS) systems are typically powered by an alternator and/or a battery and connected with a copper wire harness and a vehicle ground, such as a chassis of the vehicle. The wire harness and vehicle ground path back to the battery will have an associated resistance. This resistance is accounted for when designing an EPS system for a particular customer application.

Figure 2:
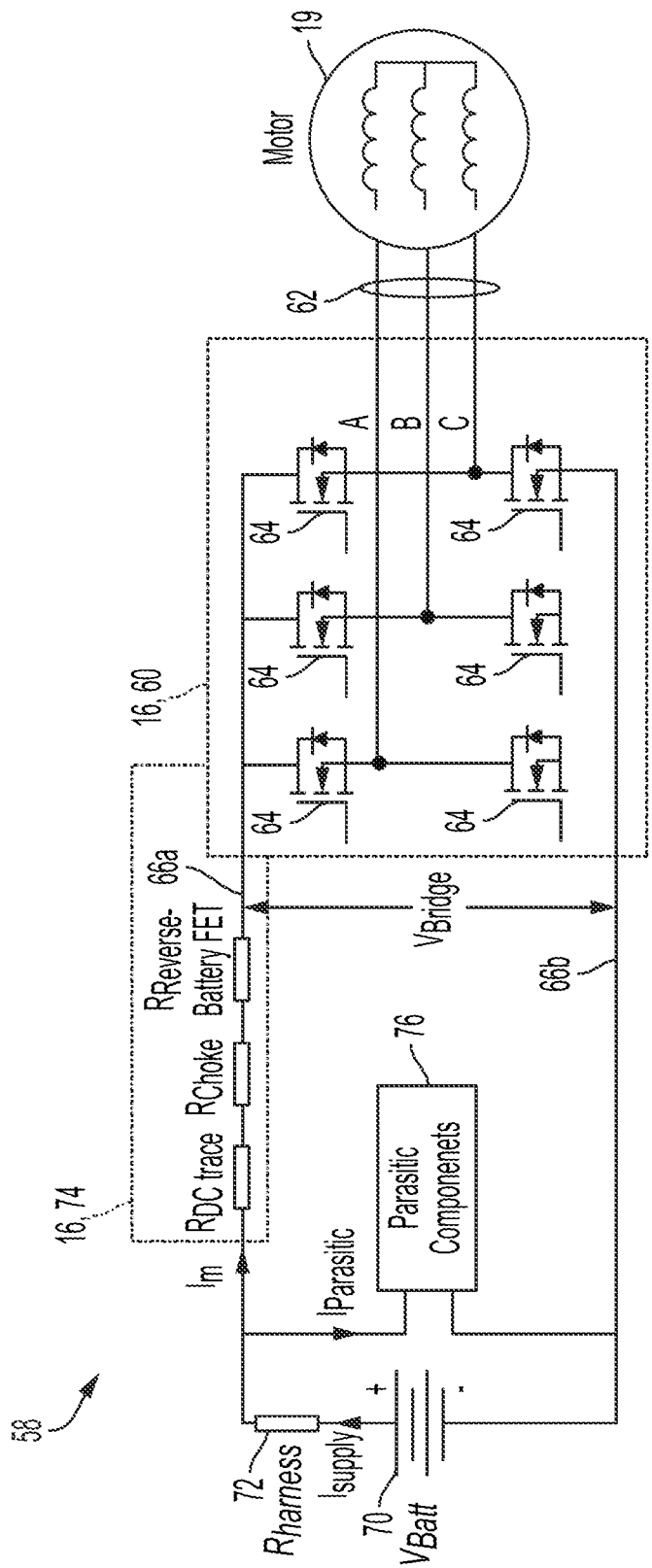
FIG. 2 generally illustrates a motor control circuit according to the principles of the present disclosure.

FIG. 2 generally illustrates a motor control circuit 58 according to the principles of the present disclosure. The motor control circuit 58 includes an inverter 60 configured to generate and supply alternating current (AC) power to the motor 19 via a set of motor leads 62. FIG. 2 shows the motor leads 62 including three phases A,B,C, corresponding to a three-phase configuration of the motor 19. However, the motor 19 may include any number of winding phases, such as five or seven phases.

The inverter 60 includes a plurality of switching transistors 64, such as field effect transistors (FETs), configured to generate the alternating current (AC) power by selectively controlling current from a DC bus 66a, 66b, which is supplied by a battery 70. A harness resistance 72 is shown on FIG. 2 and represents resistance of electrical components in a path of current flow between the battery 70 and an input to the controller 16.

The harness resistance 72 has a harness resistance value $R_{harness}$, which is a sum of resistances of the wire harness, vehicle ground, and one or more connectors. Over time and usage these connections can erode and or degrade and increase the total path resistance between the battery 70 and the controller 16. This degradation, if not accounted for, can have some serious implications as to how the EPS system will function. For example, this degradation of power supply in an EPS system can result in on/off cycling of steering assist during certain conditions, such as when relatively high loads are applied to the motor 19.

The motor control circuit 58 also includes power control circuitry 74 for controlling and regulating the power on the DC bus 66a, 66b. The power regulator circuitry 74 may include one or more resistances, including a DC trace resistance $R_{DC\_trace}$ of conductors for the DC bus 66a, 66b, a choke resistance $R_{Choke}$ of a choke (not shown), which may filter undesirable AC voltages from the DC bus 66a, 66b, and a reverse polarity isolation resistance $R_{Reverse-Battery\_FET}$ which may result from a reverse polarity isolation FET (not shown) to protect devices from damage due to the battery 70 being connected with incorrect polarity. The motor control circuit 58 also includes one or more parasitic components 76, such as accessory devices that are also connected to the battery 70 and which draw a parasitic current $I_{Parasitic}$ therefrom. The battery 70 delivers a supply current $I_{supply}$ which may be split between the parasitic current $I_{Parasitic}$ and a motor current $I_m$ that is delivered to the inverter 60 via the power control circuitry 74.

The power control circuitry 74 and/or the inverter 60 may be included within the controller 16. However, one or more components of the power control circuitry 74 and/or the inverter 60 may be provided separately from the controller 16.

As described, the EPS 40 may be associated with a vehicle. The vehicle may include a plurality of controllers and/or electronic control units. As is generally illustrated in FIG. 1, the vehicle may include a controller 16. The controller 16 may include any electronic control unit having one or more processing circuits, such as general purpose processing cores and/or application specific integrated circuits (ASICs). The controller 16 may be configured to control, for example, various aspects of the vehicle, such as aspect of the EPS 40 and/or other suitable features or components of the vehicle.

Figure 3:
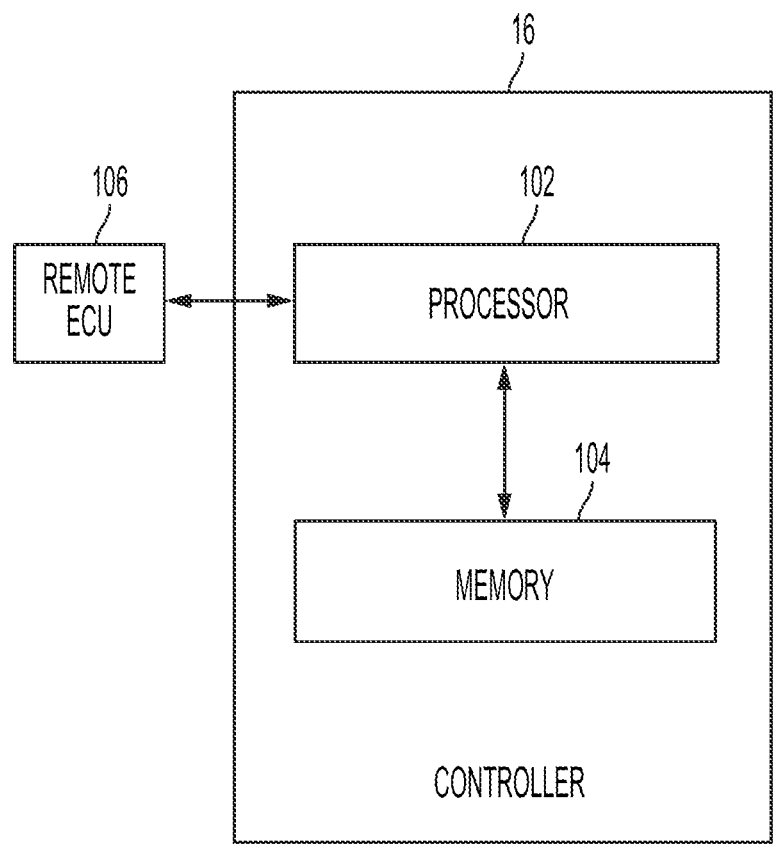
FIG. 3 generally illustrates a controller according to the principles of the present disclosure.

FIG. 3 shows a block diagram of the controller 16, which includes a processor 102 and a memory 104. The memory 104 may contain instructions that, when executed by the processor 102, cause the processor 102 to perform various functions for operating the EPS 40 system. For example, the processor 102 may command the inverter 60 to generate and apply a particular power stimulus to the motor 19. The processor 102 is also in communication with a remote ECU 106. The remote ECU 106 may include, for example, a powertrain control module (PCM) and/or a body control module (BCM). The processor 102 may report status to the remote ECU 106. Alternatively or additionally, the processor 102 may receive control commands from the remote ECU 106. In some embodiments, the processor 102 may report an estimated status of the harness resistance to the remote ECU 106 for recording and/or for reporting out. For example, the remote ECU 106 may store a diagnostic error code (DTC) regarding a high harness resistance. The remote ECU 106 may also cause an error indicator, such as a warning light or a warning message to be enunciated.

The controller 16 may apply, during a system startup, a power stimulus to the motor 19; measure a response to the application of the power stimulus to the motor; calculate, based on the response to the application of the power stimulus, a metric indicative of a status of an input power supply; compare the metric indicative of the status of the input power supply with a baseline metric to determine a degraded condition of the input power supply; and perform an action in response to determining a degraded condition of the input power supply.

The processor 102 may include any suitable processor, such as those described herein. Additionally, or alternatively, the processor 102 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various functions of the vehicle.

Additional supporting components, which may include hardware and/or software may be included to perform functions, such as reducing power draw, based on this increased total harness resistance. Therefore, there is a desire to have an accurate harness resistance estimation software subsystem. Many conventional approaches for determining a harness resistance include additional hardware to measure voltages at specific nodes and/or to measure the supply current. These conventional approaches generally will then utilize Ohm's law or a variation of it to estimate the harness resistance. There can be many shortcomings to such conventional approaches. Since EPS systems typically only include a voltage measurement system at the inverter bridge (i.e. the DC bus 66a, 66b), these conventional designs require additional hardware and cost to the system.

The present disclosure provides an alternative system and method to the conventional and expensive solutions for developing an accurate harness resistance estimate. The present disclosure provides a system and a method for estimating the harness resistance value $R_{harness}$ based on a response to a stimulus applied to the motor 19. The stimulus application and the corresponding estimation of the harness resistance value $R_{harness}$ may be performed, for example, during a vehicle start up or shut down sequence. The stimulus may take the form of regulating a sinusoidal non torque producing current through the motor 19. In some embodiments, the response measured includes a voltage at the DC bus 66a, 66b.

The stimulus wave signature may take the form of a sinusoid. A continuous time representation of the stimulus wave signature is shown in equation (1), below.

$$I_{dRef}(t) = I_{dAmp} \sin(at) \quad (1)$$

where $I_{dRef}$ is a direct-axis stimulus current or desired current in Amperes, $I_{dAmp}$ is an amplitude of the stimulus current in Amperes, a is an angular frequency of the direct axis stimulus current (Rad/sec), sin is the sine function, and t is time in seconds.

A benefit of choosing a sinusoid is that we would then expect the response or voltage measurement due to this motor current stimulus to be twice the frequency of the stimulus. This is caused due to the motor power content containing frequencies at twice the stimulus frequency. A simple mathematical example of this phenomenon is shown in equations (2) and (3), below.

$$P_m(t) = \frac{\sqrt{3}}{2}(I_{dAmp}\sin(at))(V_d\sin(at)) \quad (2)$$

$$P_m(t) = \frac{\sqrt{3}}{4}I_{dAmp}V_d(1 - \cos(2at)) \quad (3)$$

where $P_m$ is power delivered to the motor in Watts, $V_d$ is direct-axis voltage applied to windings of the motor 19 (in Volts), and cos is the cosine function.

A Fourier series decomposition at twice the stimulus frequency alongside a statistical model may be used for estimating harness resistance.

A discrete representation of a sine and cosine wave may be generated. Equations (4) and (5), below, may be used to generate a first discretized periodic ramp function $t_{Stim}[n]$ for a stimulus signal, and a second discretized periodic ramp function $t_{Resp}[n]$ for a response signal, with an assumed uniform execution rate.

$$t_{Stim}[n] = t_{Stim}[n-1] + 0.002 \quad (4)$$

$$t_{Resp}[n] = t_{Resp}[n-1] + 0.002 \quad (5)$$

where $t_{Stim}$ is a time stamp for the discretized stimulus signal, in seconds, and $t_{Resp}$ is a time stamp for the discretized response signal, in seconds, and n is a sampling instance. The 0.002 term in equations (4)-(5) correspond to a 2 ms time step. However, this is merely an example, and the time step can have a different value.

Execution rates between microprocessor calculations may not be consistent or identical. Differences in timing resulting from inconsistencies microprocessor calculating timing may be called jitter. It can be advantageous to account for such jitter. Equations (6) and (7), below include terms to compensate for jitter.

$$t_{Stim}[n] = t_{Stim}[n-1] + t_{\mu\text{-}processor} \quad (6)$$

$$t_{Resp}[n] = t_{Resp}[n] + t_{\mu\text{-}processor} \quad (7)$$

where $t_{\mu\text{-}processor}$ is a microprocessor step duration in presence of jitter (Seconds). The microprocessor step duration $t_{\mu\text{-}processor}$ may be 2 milliseconds (ms)±some jitter-offset value. However, other the microprocessor step duration may have other base values which may be greater than or less than 2 ms.

Since sine and cosine waves within a microprocessor may be represented by a look up table, it may be necessary to provide a periodic input to the lookup table. The periodic input may take the form of a periodic ramp function, such as the waveforms shown in FIG. 4

Figure 4:
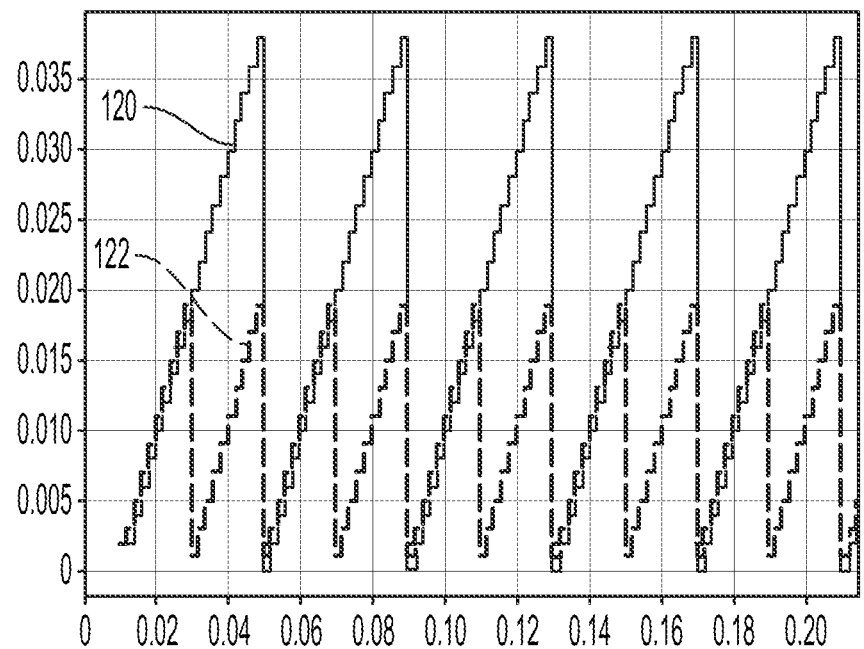
FIG. 4 shows a graph including plots of discretized periodic ramp functions for a stimulus current command and for a response signal, according to the principles of the present disclosure.
Figure 5:
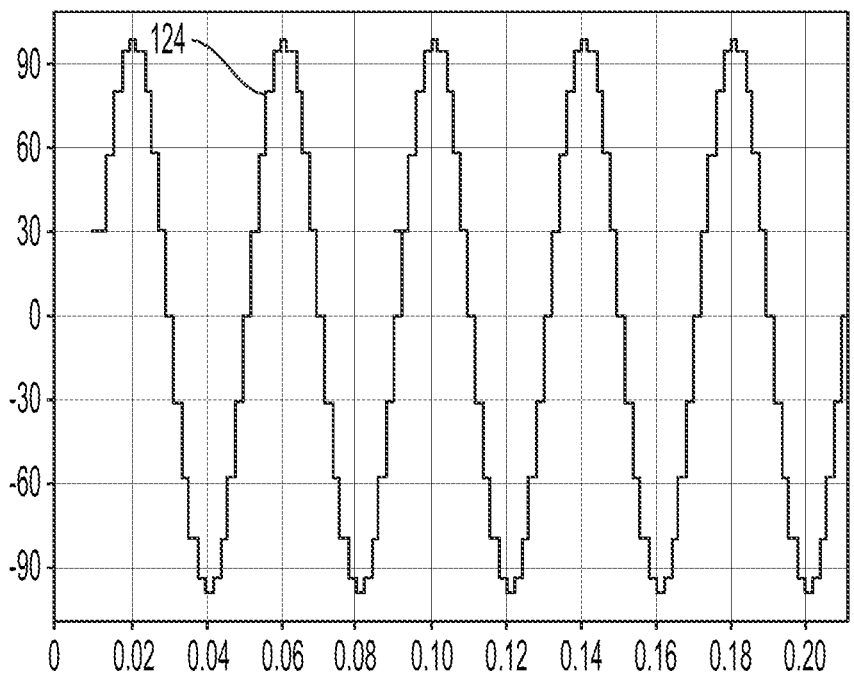
FIG. 5 shows a plot of a discretized sinusoidal stimulus signal, according to the principles of the present disclosure.

FIG. 4 shows a graph including a first plot 120 of the first discretized periodic ramp function $t_{Stim}[n]$ for a stimulus current command, and a second plot 122 showing the second discretized periodic ramp function $t_{Resp}[n]$ for the response signal. The second discretized periodic ramp function $t_{Resp}[n]$ has twice the frequency of the first discretized periodic ramp function $t_{Stim}[n]$. Thus, the second plot 122 includes two ramps for each ramp of the first plot 120. FIG. 5 shows a third plot 124 of a discretized sinusoidal stimulus signal generated based on the first discretized periodic ramp function $t_{Stim}[n]$ shown in the first plot 120.

The controller 16 may generate the discretized periodic ramp functions $t_{Stim}[n]$, $t_{Resp}[n]$ for each of the stimulus current command and the response signal by periodically incrementing each of the ramp functions $t_{Stim}[n]$, $t_{Resp}[n]$ and periodically resetting each of the ramp functions $t_{Stim}[n]$, $t_{Resp}[n]$ based on a stimulus frequency $f_{sStim}$. The stimulus frequency $f_{sStim}$ may have a predetermined value, such as 25 Hz. However, the stimulus frequency $f_{sStim}$ may have a different value.

The periodic resetting of the first discretized periodic ramp function $t_{Stim}[n]$ may include determining if the first discretized periodic ramp function $t_{Stim}[n]$ is greater than a first threshold value equal to $$\frac{1}{f_{sStim}}$$

(i.e. 0.04 tor the stimulus frequency $f_{sStim}$=25 Hz). The periodic resetting may then include resetting the first discretized periodic ramp function $t_{Stim}[n]$ in response to determining the first discretized periodic ramp function $t_{Stim}[n]$ being greater than the first threshold value $$\frac{1}{f_{sStim}}.$$

The resetting the first discretized periodic ramp function $t_{Stim}[n]$ may include subtracting the first threshold value $$\frac{1}{f_{sStim}}$$

from the value of the first discretized periodic ramp function $t_{Stim}[n]$. The second discretized periodic ramp function $t_{Resp}[n]$ may be similarly reset based on a second threshold value equal to $$\frac{1}{2f_{sStim}}$$

(i.e. 0.02 for the stimulus frequency $f_{sStim}$=25 Hz). This periodic resetting forms the periodic nature of the A stimulus current $I_{Ref}$ may be determined for the inverter 60 to supply to the motor 19. The stimulus current $I_{Ref}$ may be represented as a d-axis current component $I_{dRef}$ and a q-axis current component $I_{qRef}$. The d,q axis current components may be represented in a discretized form as $I_{dRef}[n]$, $I_{qRef}[n]$ at step time n. For a non-torque producing stimulus current, the q-axis stimulus current $I_{qRef}[n]$ may be held at 0 Amps, as shown in equation (8), below. The d-axis stimulus current $I_{dRef}[n]$ may be determined using equation (9), below.

$$I_{qRef}[n]=0 \quad (8)$$

$$I_{dRef}[n]=I_{dAmp}\sin(2\pi f_{sStim}t_{Stim}[n]) \quad (9)$$

The system and method of the present disclosure may determine the harness resistance value $R_{harness}$ based on a response to the application to the stimulus. The response may be measured as a change in the bridge voltage $V_{Bridge}$ of the DC bus 66a, 66b. A mathematical representation of the response measurement is shown in equations (10)-(11), below:

$$V_{Avg} = \frac{1}{n_{Calibration}-1} \sum_{n=1}^{n_{Calibration}-1} V_{meas}[n] \quad (10)$$

$$P_{mAvg} = \frac{\sqrt{3}}{2(n_{Calibration}-1)} \sum_{n=1}^{n_{calibration}-1} I_{dMea}[n]V_a[n] \quad (11)$$

where $V_{Avg}$ is an average voltage (Volts), $V_{meas}[n]$ is a measured value of the bridge voltage $V_{Bridge}$ at time stamp n (Volts), and $n_{Calibration}$ is a number of collected samples, and $P_{mAvg}$ is an average motor power signal (Watts) representing an average power supplied by the inverter 60 to the motor 19 over the sampling time, $I_{dMea}[n]$ is a measured d-axis current at time stamp n, and $V_d[n]$ is a d-axis voltage of the motor 19 at time stamp n (Volts).

Equation (12), below represents the voltage measurement magnitude $V_{Mag}$ (Volts) of the frequency content at twice the stimulus frequency (i.e. the response signal of interest).

$$V_{Mag} = \frac{2}{n_{calibration}-1}\sqrt{\left(\sum_{n=1}^{n_{calibration}-1} V_{meas}[n]\cos(4\pi f_{sStim}t_{Stim}[n])\right)^2 + \left(\sum_{n=1}^{n_{calibration}-1} V_{meas}[n]\sin(4\pi f_{sStim}t_{Stim}[n])\right)^2} \quad (12)$$

Note that an equation similar to equation (12) may be used to determine a magnitude of the motor power $P_{mMag}$.

A statistical model may be used to determine a harness resistance estimate $R_{hEst}$ for estimating the harness resistance value $R_{harness}$. Alternatively or additionally, the statistical model may be used to increase the accuracy of another estimate of the harness resistance value $R_{harness}$.

The statistical model for the harness resistance estimate $R_{hEst}$ may be implemented using equation (13), below.

$$R_{hEst} = R_{hNom}\left(\frac{V_{Mag}V_{Avg}}{V_{MagNom}V_{AvgNom}}\right) + R_{hOffset} \quad (13)$$

where $R_{hNom}$ is a nominal harness resistance gain constant (Ohms), $V_{Mag}$ is a magnitude of the bridge voltage signal (i.e. an average of the response) (Volts), $V_{Avg}$ is an average of the bridge voltage signal (i.e. an average of the response) (Volts), $V_{MagNom}$ is a nominal bridge voltage magnitude constant (Volts), $V_{AvgNom}$ is a nominal bridge voltage average constant (Volts), and $R_{hOffset}$ is a harness resistance offset constant (Ohms). Note that $R_{hNom}$, $V_{MagNom}$, $V_{AvgNom}$, and $R_{hOffset}$ are each calibration constants.

An alternative implementation for the statistical model for the harness resistance estimate $R_{hEst}$ is provided using equation (14), below.

$$R_{hEst} = R_{hNom}\left(\frac{(V_{Mag}+V_{MagOffset})(V_{Avg}+V_{AvgOffset})}{V_{MagNom}V_{AvgNom}}\right) + R_{hOffset} \quad (14)$$

where $R_{hNom}$ is a nominal harness resistance gain constant (Ohms), $V_{Mag}$ is a magnitude of the bridge voltage signal (i.e. an average of the response) (Volts), $V_{MagOffset}$ is a voltage magnitude offset constant (Volts), $V_{Avg}$ is an average of the bridge voltage signal (i.e. an average of the response) (Volts), $V_{AvgOffset}$ is a voltage average offset constant (Volts), $V_{MagNom}$ is a nominal bridge voltage magnitude constant (Volts), $V_{AvgNom}$ is a nominal bridge voltage average constant (Volts), and $R_{hOffset}$ is a harness resistance offset constant (Ohms). Note that $R_{hNom}$, $V_{MagOffset}$, $V_{MagNom}$, $V_{AvgOffset}$, $V_{AvgNom}$, and $R_{hOffset}$ are each calibration constants. Note also that Equation (14) is similar to equation (13), but with the addition of the voltage magnitude offset constant $V_{MagOffset}$ and the voltage average offset constant $V_{AvgOffset}$.

In some cases, applying the stimulus signal to the motor 19 can cause a voltage drop on the DC bus 66a, 66b that is sufficient to impede operation of the controller 16 and/or other devices connected thereto. To protect against this, the system and method of the present disclosure may include additional functionality to prevent the stimulus from causing a voltage drop on the DC bus 66a, 66b of a magnitude that can impede operation of the controller 16 or the other devices. For example, the processor 102 may have a minimum operating voltage $V_{min}$, and the stimulus maybe regulated to prevent the bridge voltage $V_{Bridge}$ of the DC bus 66a, 66b from dropping below the minimum operating voltage $V_{min}$.

A reactive approach may be employed to mitigate the effects of such self-induced power cycling, such as counting a number of times this power cycle happens and then turning off the stimulus response feature of the number exceeds a predetermined value in a given time. This can prevent feedback loops where the controller 16 becomes stuck restarting over and over. However, it is desirable to not enter into this self-induced power cycling condition at all. Accordingly, a proactive approach is provided. In some embodiments, both reactive and proactive approaches may be combined to avoid self-induced power cycling and to mitigate its effects, if it were to happen.

Motor power $P_m(t)$ as a function of time, when the q-axis current $I_q$ is zero and the d-axis current $I_d$ is non-zero, may be described using equation (15), below.

$$P_m(t) = \frac{\sqrt{3}}{2} V_d(t) I_d(t) \tag{15}$$

where $V_d(t)$ is d-axis voltage applied to the motor 19 as a function of time, and $I_d(t)$ is d-axis current supplied to the motor 19 as a function of time.

When considering a sinusoidal direct current stimulus, the motor power $P_m(t)$ may be described as shown in equation (16), below.

$$P_m(t) = \tag{16}$$

$$\frac{3 I_{dAmp}^2 B_{wI_d}^2}{4(B_{wI_d}^2 + a^2)^2} \Big( (B_{wI_d} L_d a - R_m a) \cos(at) + (B_{wI_d} R_m + L_d a^2) \sin(at) -$$

$$e^{-B_{wI_d} t} (-R_m a + B_{wI_d} L_d a)\Big) \big(B_{wI_d} \sin(at) - a\cos(at) + a e^{-B_{wI_d} t}\big)$$

where $I_{dAmp}$ is a magnitude of the d-axis current (in Amperes), $B_{wI_d}$ is a bandwidth of the d-axis current (in Hertz), and $R_m$ is a motor resistance (in Ohms).

Ignoring the transient term in equation (16) yields equation (17), below.

$$P_m(t) = \frac{3 I_{dAmp}^2 B_{wI_d}^2}{8(B_{wI_d}^2 + a^2)^2} \Big( (-a^2(B_{wI_d} L_d - R_m) + B_{wI_d}(B_{wI_d} R_m + L_d a^2)) + \tag{17}$$

$$(-a^2(B_{wI_d} L_d - R_m) - B_{wI_d}(B_{wI_d} R_m + L_d a^2))\cos(2at) +$$

$$(B_{wI_d} a(B_{wI_d} L_d - R_m) - a(B_{wI_d} R_m + L_d a^2))\sin(2at)\Big)$$

where $V_d(t)$ is a d-axis voltage of the motor 19, and $L_d$ is a d-axis inductance of the motor 19 (in Henrys).

Splitting equation (17) into an average motor power $P_{mAvg}$ and a magnitude of the motor power $P_{mMag}$ yields equations (18) and (19), below:

$$P_{mAvg} = \frac{3 I_{dMaxAmp}^2 B_{wI_d}^2 R_m}{8(B_{wI_d}^2 + a^2)} \tag{18}$$

$$P_{mMag} = \frac{3 I_{dMaxAmp}^2 B_{wI_d}^2}{8(B_{wI_d}^2 + a^2)} \sqrt{a^2 L_d^2 + R_m^2} \tag{19}$$

where $I_{dMaxAmp}$ is a maximum allowable d-axis command current (in Amperes).

Peak power $P_{mPk}$ of the motor 19 can be represented as shown in equation (20), below.

$$P_{mPk} = P_{mAvg} + P_{mMag} \tag{20}$$

Solving equations (18)-(20) for the maximum allowable d-axis command current $I_{dMaxAmp}$ yields equation (21), below.

$$I_{dMaxAmp} = \sqrt{\frac{P_{mPk} 8(B_{wI_d}^2 + a^2)}{3 B_{wI_d}^2 (R_m + \sqrt{a^2 L_d^2 + R_m^2})}} \tag{21}$$

Equation (21) shows the relationship between peak motor power $P_{mPk}$ and maximum allowable d-axis command current $I_{dMaxAmp}$, which may be used to determine an appropriate amplitude of the stimulus for estimating the harness resistance value $R_{harness}$.

The next step is determining the peak motor power $P_{mPk}$ that would cause the part to shut down (i.e. a power that, if supplied to the motor 19, would cause the bridge voltage $V_{Bridge}$ of the DC bus 66a, 66b to drop to a level that would not sustain reliable operation of the controller 16. Equation (22) depicts a mathematical representation of this peak motor power $P_{mPk}$ for continued reliable operation:

$$P_{mPk} = \frac{V_{Batt} V_{SD} - V_{SD}^2}{R_{hEst}[n-1]} \tag{22}$$

where $V_{SD}$ is a minimum operating voltage for the controller 16, $R_{hEst}[n-1]$ is a previously-determined estimate of the harness resistance value $R_{harness}$, and $V_{Batt}$ is an approximation of the voltage of the battery 70, which may be determined by measuring the bridge voltage $V_{Bridge}$ prior to stimulus when near zero current is being drawn by the inverter 60. This will then allow for a calculation of maximum d-axis current for stimulus $I_{dAmp\_max}$. The minimum operating voltage $V_{SD}$ may be determined, for example, as a minimum voltage for the processor 102 to reliably function. Alternatively or additionally, the minimum operating voltage $V_{SD}$ may be determined based on a voltage required to maintain some other vital component of the controller 16 in an operational state.

The determined maximum d-axis current for stimulus $I_{dAmp\_max}$ may be used for performing various different system actions. In some embodiments, the system may be configured to not perform the stimulus if the maximum d-axis current for stimulus $I_{dAmp\_max}$ falls below some predetermined value. Alternatively or additionally, the amplitude of the stimulus current $I_{dAmp}$ may be modified within a given range, not to exceed the maximum d-axis current for stimulus $I_{dAmp\_max}$, and as long as the control system 24 still yields an accurate estimate of the harness resistance value $R_{harness}$. These are merely examples, and the determined maximum d-axis current for stimulus $I_{dAmp\_max}$ may be used for other purposes.

Figure 6:
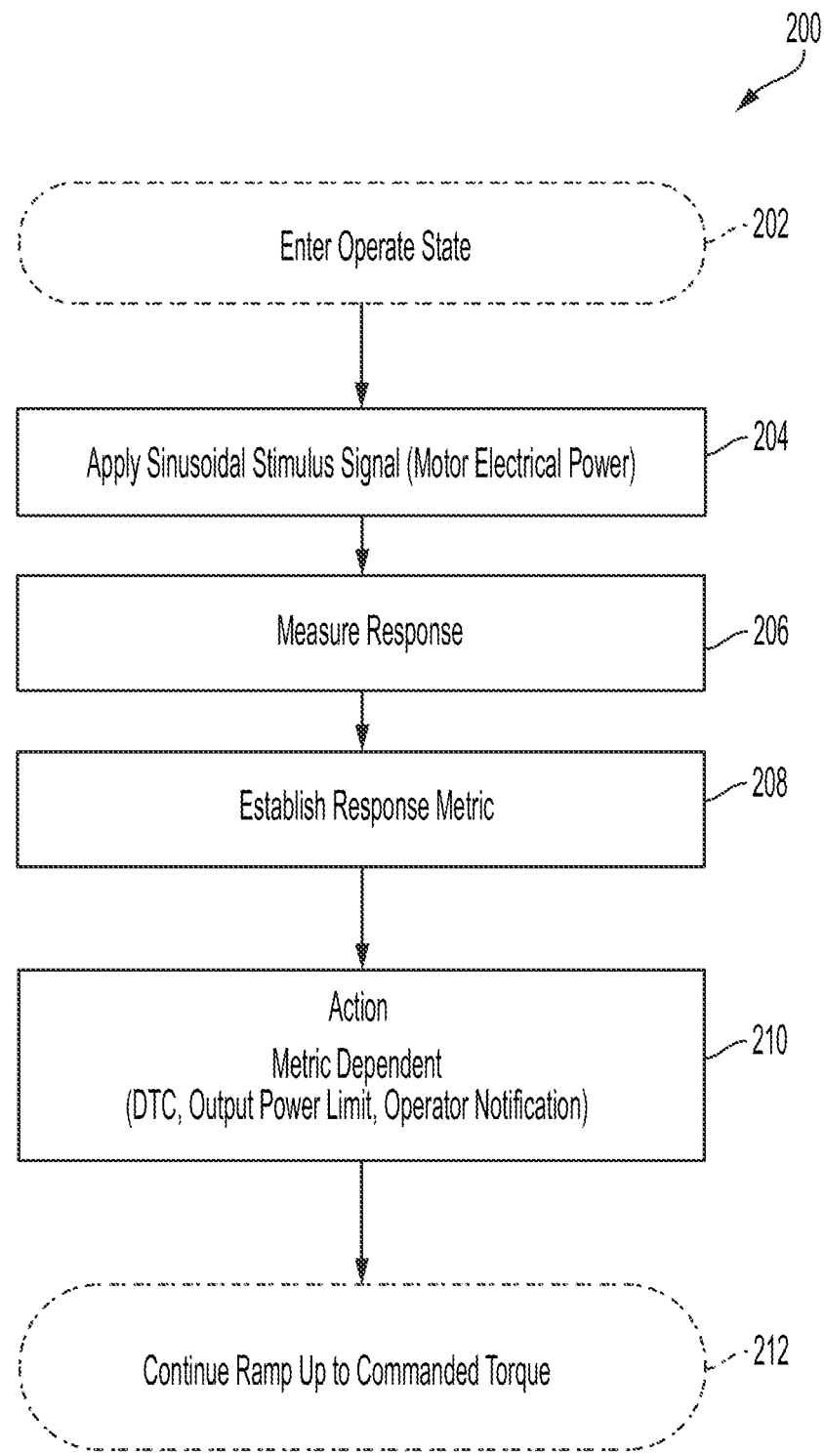
FIG. 6 shows a flow diagram generally illustrating a method for diagnosing an input power supply providing power to a motor in a vehicle, according to the principles of the present disclosure.

FIG. 6 is a flow diagram generally illustrating a method 200 for controlling a motor 19, according to the principles of the present disclosure. The method 200 can be performed by the processor 102, in accordance with some embodiments of the present disclosure. As can be appreciated in light of the disclosure, the order of operation within the method is not limited to the sequential execution as illustrated in FIG. 6, but may be performed in one or more varying orders as applicable and in accordance with the present disclosure.

At 202, the method 200 starts by entering an operating state. For example, the processor 102 may start performing the method 200 during a system startup, such as a vehicle startup or accessory power energization procedure. In some embodiments, the method 200 may be run as part of an initialization (init) function at the beginning of an "Operate" state of a control system 24.

At 204, the method 200 applies a sinusoidal stimulus signal to the motor 19. The sinusoidal stimulus signal may include an alternating current (AC) voltage and corresponding electrical power supplied to the motor 19. For example in some embodiments, the processor 102 may cause an inverter to apply V*I (vector quantities of applied motor voltage and motor current) electric power to motor phases of the motor 19, In some embodiments, for example in ADAS and SbW applications, the electric power applied to the motor 19 causes the motor 19 to produce a non-zero motor torque. In some embodiments, such as in EPS applications, the electric power applied is of a nature to cause the motor 19 to produce zero motor torque. For example, a Permanent Magnet Synchronous Machine (PMSM) type of motor 19 may be supplied with a sinusoidal motor current on the direct axis only (Id), with a zero motor current command on the quadrature axis (Iq) which does not produce Motor Torque, and therefore should not produce handwheel motion. In some embodiments, a torque command to the motor 19 is held to zero while the Electrical Power Excitation is applied.

In some embodiments, sinusoidal stimulus signal is a non-torque producing voltage that causes the motor 19 to produce minimal or zero net torque. For example, non-torque producing voltage that causes the motor 19 to produce zero net torque or a very small amount of net torque that can be overcome by braking and/or by other friction such that no rotational motion is generated.

At 206 the method 200 measures a response to the application of the power stimulus to the motor 19. For example, the input voltage may be measured on a power input of the controller 16 where the controller 16 receives power from the vehicle power supply 10 via the wiring harness 12, while the power stimulus is applied to the motor 19. In some embodiments, such as where the electric power applied to the motor 19 causes the motor 19 to produce a non-zero torque, the response measured at step 206 includes a motor angle of the motor 19.

At 208 the method 200 calculates, based on the response to the application of the power stimulus, a response metric. The response metric may also be called simply a "metric". This response metric may be indicative of a status of an input power supply, such as the power supplied from the vehicle power supply 10 to the controller 16 via the wiring harness 12. For example, the processor 102 may measure a sag in the input voltage resulting from the application of electric power to the motor 19, and multiply an amount of that sag by a predetermined constant to calculate the response metric. In some embodiments, the response metric may be proportional to an estimated resistance on the power supply to the controller 16. In some embodiments, the response metric may not be proportional to an estimated resistance on the power supply to the controller 16.

At 210 the method 200 performs an action based upon the metric. For example, the processor 102 may take an action in response to determining the metric indicates a fault or other indicator of a degraded condition. Step 210 may include comparing the metric indicative of the status of the input power supply with a baseline metric to determine if the metric is indicative of a degraded condition of the input power supply, and the action may be performed only in response to determining the degraded condition of the input power supply. The action or response to be performed may depend on a value or values of the metric. Actions to be taken may include, for example, generating a diagnostic trouble code (DTC), limiting output power of the motor 19, and/or notifying an operator of the vehicle. Generating the DTC may include storing the DTC in memory of one or more electronic control units, such as a powertrain control module (PCM) or an EPS controller. Other associated data may be stored with the DTC, such as date and time of generation, and associated parameters and/or conditions. Notifying the operator of the vehicle may include setting a dashboard warning light and/or a HMI message indicating that service is required.

At 212 the method 200 concludes by ramping-up the motor 19 to a commanded torque. For example, step 212 may include the control system 24 resuming functional operation. Such functional operation may be impacted by the action, for example, in cases where output power of the motor 19 is limited.

Figure 7A:
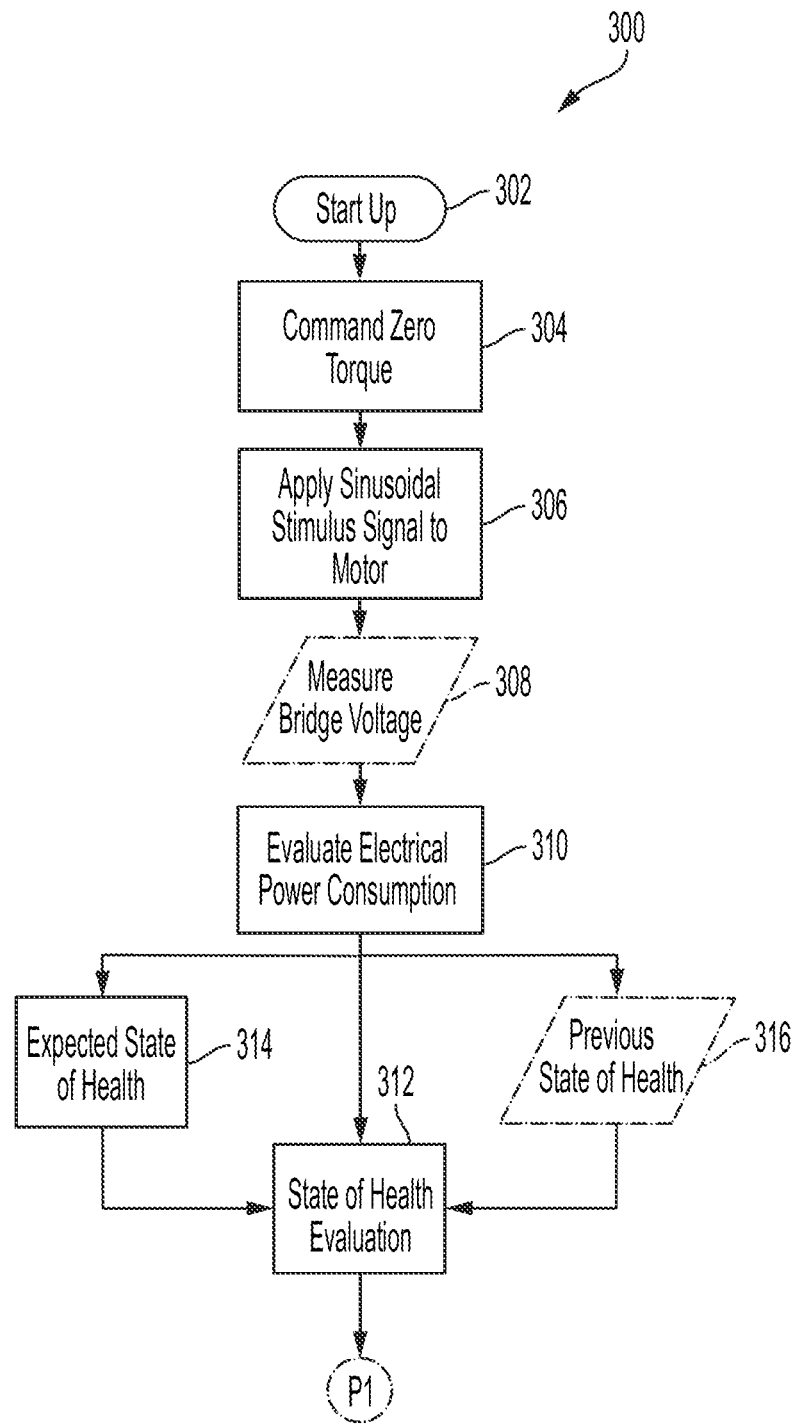
FIGS. 7A-7C show a flow diagram generally illustrating a method for controlling a motor, according to the principles of the present disclosure.
Figure 7B:
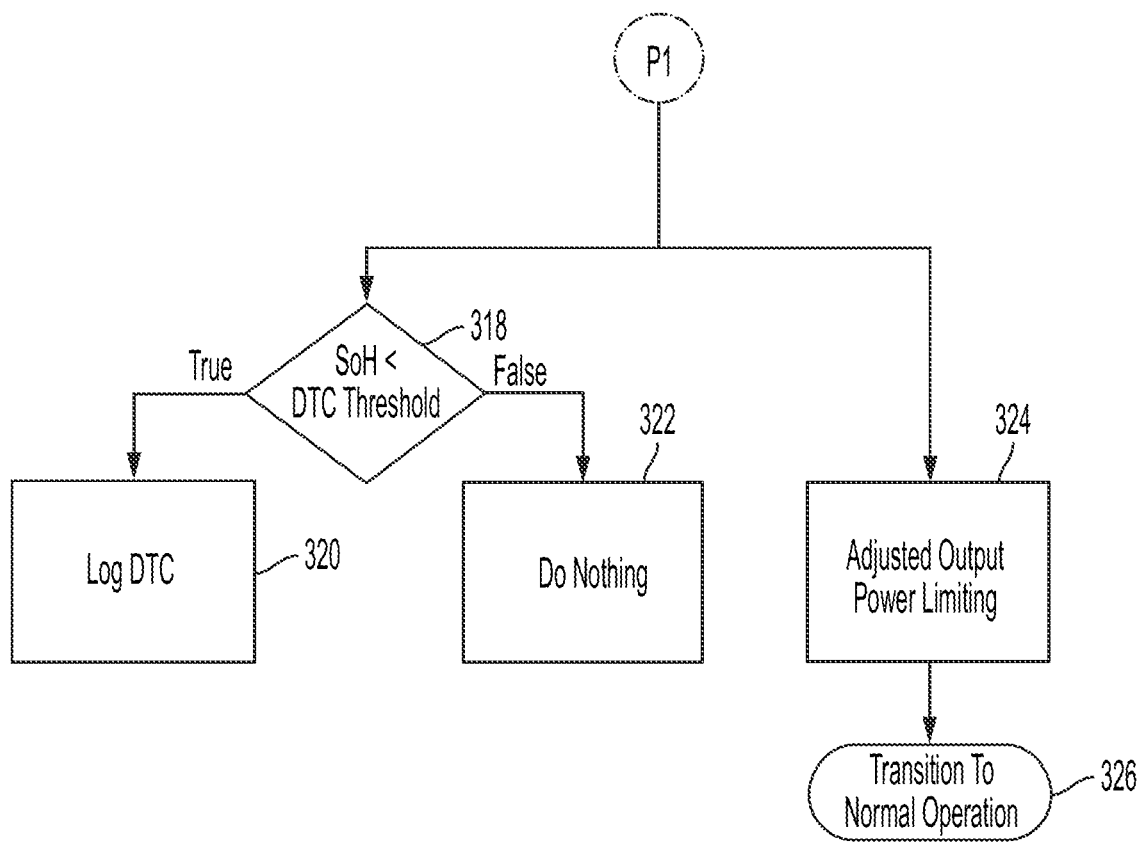
Figure 7C:
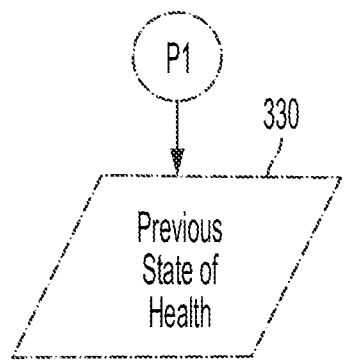

FIGS. 7A-7C show a flow diagram generally illustrating a method 300 for controlling a motor 19, according to the principles of the present disclosure. The method 300 can be a variation and/or a specific version of the method 200 shown in FIG. 3. The method 300 can be performed by the processor 102, in accordance with some embodiments of the present disclosure. As can be appreciated in light of the disclosure, the order of operation within the method is not limited to the sequential execution as illustrated in FIGS. 7A-7C, but may be performed in one or more varying orders as applicable and in accordance with the present disclosure.

At 302, the method 300 starts with a startup event. For example, the processor 102 may start performing the method 300 during a system startup, such as a vehicle startup or accessory power energization procedure. In some embodiments, the method 300 may be run as part of an initialization (init) function at the beginning of an "Operate" state of a control system 24.

At 304, the method 300 commands the motor 19 to produce zero torque. For example, the processor 102 may cause the motor 19 to be in a non-torque producing mode for some period of time during the method 300. The motor 19 may include a motor in an EPS system and/or a SbW system.

At 306, the method 300 applies a sinusoidal stimulus signal to the motor 19. For example in some embodiments, the processor 102 may cause an inverter to apply a sinusoidal or alternating current (AC) voltage as a voltage vector $\vec{V}$ to supply a corresponding electric power to the motor 19.

At 308, the method 300 measures a bridge voltage. The bridge voltage may be a voltage between conductors of the wiring harness 12 that supplies power from the vehicle power supply 10 to the controller 16. For example, the bridge voltage may be a voltage of a power supply input from the wiring harness 12 at the controller 16, and which is rectified and converted or otherwise controlled by the controller 16 to power the motor 19. Alternatively or additionally, the bridge voltage may include a voltage across a DC bridge within the controller 16 and which is input to an inverter providing AC power to the motor 19.

At 310, the method 300 evaluates an electrical power consumption. For example, the processor 102 may compute an amount of power consumed by the motor 19 and the controller 16, based on the bridge voltage and the applied motor voltage and motor current supplied to the motor 19. Additionally the processor 102 may compute the power consumed by the wiring harness 12, and knowing the voltage may calculate a resistance of the wiring harness 12. By inducing a current load through the motor 19 and causing a current draw on the wiring harness 12 and looking the voltage bridge effect, the system and method of the present disclosure may evaluate the power consumption on one or both of the wiring harness 12 that supplies the controller 16 and/or on a motor wiring connection (not shown) which electrically connects the controller 16 and the motor 19. By evaluating the power consumption on the wiring harness 12 and/or the motor wiring connection, the controller 16 may effectively evaluate a resistance of the wiring harness 12 and/or the motor wiring connection. The motor wiring connection may include one or more conductors, such as wires or bus bars, and/or one or more connectors, such as spade connectors, receptacles, plugs, lugs, wiring terminals, etc., etc.

At 312, the method 300 performs a state of health (SoH) evaluation. For example, the processor 102 may compute a preliminary SoH value based on the electrical power consumption, harness resistance, and/or the bridge voltage. Alternatively or additionally, the processor 102 may determine a new SoH value based on the preliminary SoH value in combination with one or more other factors, such as an expected SoH and/or one or more pervious SoH values.

At 314, the method 300 determines the expected SoH. The expected SoH may also be called a baseline SoH. For example, the processor 102 may compute the expected SoH value based on the electrical power consumption, when the power supply is in a healthy or non-degraded condition. Step 312 may use the expected SoH for computing a new SoH value. For example, one factor in determining the new SoH may be a difference between the preliminary SoH value and one or more expected SoH values.

At 316, the method 300 determines a previous SoH value. For example, the processor 102 may load one or more pervious SoH values from a storage memory. Step 312 may use the previous SoH value for computing a new SoH value. For example, one factor in determining the new SoH may be a degree of change from one or more previous SoH values.

In some embodiments, the processor 102 includes logic to track the previous state of the metric (e.g. one or more previous SoH values) in order to facilitate decisions on whether to latch the reduced output power behavior or reset performance back to full. It may also be used for other purposes, such as learning expected behavior of the specific system at startup and adjusting metric calculations.

FIG. 7B shows a continuation of the method 300, in accordance with some embodiments. At step 318, the method 300 determines if an DTC threshold is met. For example, the processor 102 may compare the SoH value computed at step 312 to a predetermined DTC threshold value.

At step 320, the method 300 logs an DTC in response to determining that the DTC threshold is met at step 318. For example, the processor 102 may log the DTC, which may include storing a time and/or other parameters when the DTC threshold was met.

At step 322, the method 300 does nothing in response to determining that the DTC threshold is not met at step 318. For example, the processor 102 proceed with other tasks in response to determining that the DTC threshold is not met.

At step 324, the method 300 adjusts an output power limiting. For example, the processor 102 may adjust an output power limiting value that controls a maximum limit of power that is output to the motor 19 in response to the SoH value. In some embodiments, a SoH value that is indicative of the input power supply having a degraded condition may cause the output power limiting value to be set to a predetermined value or to be increased by a predetermined amount.

At step 326, the method 300 transitions to normal operation. For example, the processor 102 may operate the system with the motor 19 in an operational mode for producing torque to steer the vehicle. The normal operation may continue with the output power to the motor 19 limited by the output power limiting value.

In some embodiments, and as shown in FIG. 7C, the method 300 includes storing a previous SoH value. For example, the processor 102 may store the SoH value calculated at step 312 into a storage memory for future reference, and/or for future use, such as in step 316.

Figure 8:
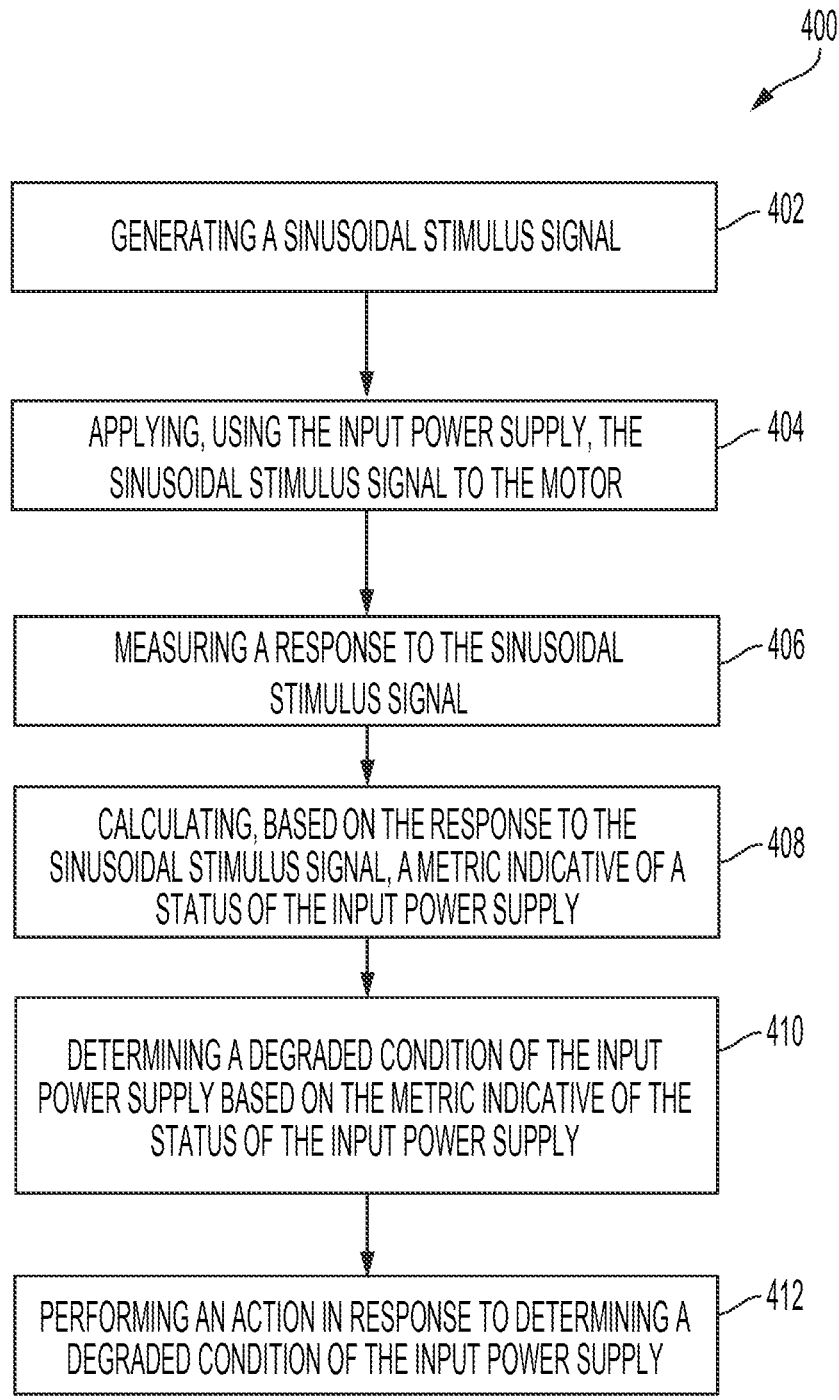
FIG. 8 shows a flow diagram illustrating a first method for diagnosing an input power supply providing power to a motor in a vehicle, according to the principles of the present disclosure.

FIG. 8 shows a flow diagram generally illustrating a first method 400 for diagnosing an input power supply providing power to a motor in a vehicle, according to the principles of the present disclosure. The first method 400 can be performed by the processor 102, in accordance with some embodiments of the present disclosure. As can be appreciated in light of the disclosure, the order of operation within the method is not limited to the sequential execution as illustrated in FIG. 8, but may be performed in one or more varying orders as applicable and in accordance with the present disclosure.

At step 402, The first method 400 generates a sinusoidal stimulus signal. The sinusoidal stimulus signal may include a magnitude or amplitude and a frequency.

In some embodiments generating the sinusoidal stimulus signal includes generating a discretized sinusoidal stimulus signal approximating a sinusoid. For example in some embodiments, the processor 102 may generate the discretized sinusoidal signal having a plurality of discrete steps. An example of such a discretized sinusoidal stimulus signal is shown in FIG. 5.

In some embodiments, generating the discretized sinusoidal stimulus signal at step 402 includes generating a discretized periodic ramp signal. An example of such a discretized sinusoidal stimulus signal is shown in the first plot 120 of FIG. 4. In some embodiments, generating the discretized sinusoidal stimulus signal also includes determining the discretized sinusoidal stimulus signal based on the discretized periodic ramp signal. For example, a lookup table may be used to determine a value of the discretized sinusoidal stimulus signal based on a given value of the discretized periodic ramp signal. Alternatively or additionally, the value of the discretized sinusoidal stimulus signal may be calculated or otherwise determined based on a given value of the discretized periodic ramp signal.

In some embodiments, generating the discretized sinusoidal stimulus signal at step 402 includes determining a value using a term to compensate for jitter introduced by an inconsistency in timing to perform at least one calculation. For example, determining the value may include calculating the first discretized periodic ramp function $t_{Stim}[n]$ using equation (6), provided above, which includes the microprocessor step duration in presence of jitter term $t_{\mu\text{-}processor}$ to compensate for jitter introduced by an inconsistency in timing.

At step 404, The first method 400 applies, using the input power supply, the sinusoidal stimulus signal to the motor. For example in some embodiments, the processor 102 may cause an inverter to apply the sinusoidal stimulus signal as a sinusoidal d-axis voltage to the motor 19. The motor 19 may include a motor in an EPS system and/or a SbW system.

At step 406, The first method 400 measures a response to the sinusoidal stimulus signal. For example, the input voltage may be measured on a power input of the controller 16 where the controller 16 receives power from the vehicle power supply 10 via the wiring harness 12, while the sinusoidal stimulus signal is applied to the motor 19. Alternatively or additionally, the input voltage may include a bridge voltage of a DC bridge which supplies DC power to an inverter providing AC power to the motor 19.

At step 408, The first method 400 calculates, based on the response to the sinusoidal stimulus signal, a metric indicative of a status of the input power supply. The status of the input power supply, may include the status of the power supplied from the vehicle power supply 10 to the controller 16 via the wiring harness 12. For example, the processor 102 may measure a sag in the input voltage resulting from the application of electric power to the motor 19, and multiply an amount of that sag by a predetermined constant to calculate the response metric. In some embodiments, the response metric may be proportional to an estimated resistance on the power supply to the controller 16. The estimated resistance may include a resistance in the wiring harness 12. In some embodiments, the response metric may not be proportional to an estimated resistance on the power supply to the controller 16.

At step 410, The first method 400 determines a degraded condition of the input power supply based on the metric indicative of the status of the input power supply. For example, the processor 102 may compare the metric indicative of the status of the input power supply with a baseline value to determine if the metric is indicative of a degraded condition of the input power supply.

In some embodiments, determining the degraded condition of the input power supply includes estimating a harness resistance value using a statistical model. For example in some embodiments, the processor 102 may estimate the harness resistance value $R_{harness}$ by computing the statistical model.

In some embodiments, estimating the harness resistance value using the statistical model includes computing a harness resistance estimate based on a magnitude of the response to the sinusoidal stimulus signal and an average of the response to the sinusoidal stimulus signal. For example, the processor 102 may execute instructions to implement equation (13), described above, to calculate a harness resistance estimate $R_{hEst}$. Alternatively or additionally, the processor 102 may execute instructions to implement equation (14), described above, to calculate the harness resistance estimate $R_{hEst}$.

At step 412, The first method 400 performs an action in response to determining a degraded condition of the input power supply. For example, the processor 102 may take an action in response to determining the degraded condition of the input power supply. The action may depend on a value or values of the metric. The action may include, for example, generating a diagnostic trouble code (DTC), limiting output power of the motor 19, communicating a message to the remote ECU 106, and/or notifying an operator of the vehicle. Generating the DTC may include storing the DTC the memory 105 of the controller 16 and/or in a memory of one or more remote ECUs 106, such as a powertrain control module (PCM).

Figure 9:
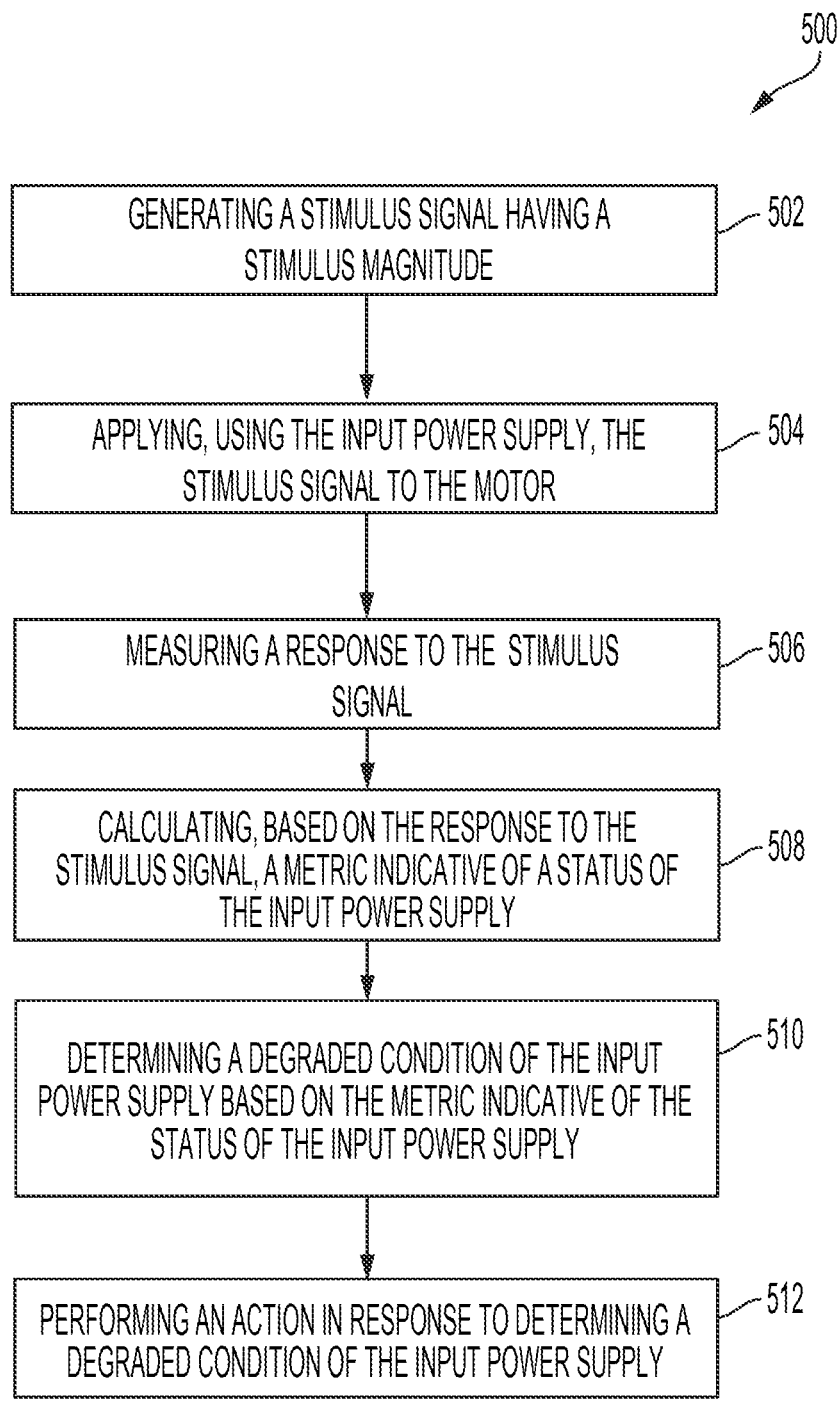
FIG. 9 shows a flow diagram illustrating a second method for diagnosing an input power supply providing power to a motor in a vehicle, according to the principles of the present disclosure.

FIG. 9 shows a flow diagram generally illustrating a second method 500 for diagnosing an input power supply providing power to a motor in a vehicle, according to the principles of the present disclosure. One or more steps of the second method 500 can be performed by the processor 102, in accordance with some embodiments of the present disclosure. As can be appreciated in light of the disclosure, the order of operation within the method is not limited to the sequential execution as illustrated in FIG. 9, but may be performed in one or more varying orders as applicable and in accordance with the present disclosure.

At step 502, The second method 500 generates a stimulus signal having a stimulus magnitude. In some embodiments, the stimulus signal may include a sinusoidal stimulus signal. However, the stimulus signal may include a periodic or a non-periodic waveform. For example, the stimulus signal may have a triangular or a sawtooth waveform shape.

In some embodiments, generating the stimulus signal includes determining the stimulus magnitude based on an estimate of the harness resistance value $R_{harness}$. The estimate of the harness resistance value $R_{harness}$ may include a harness resistance estimate $R_{hEst}$ determined using a method of the present disclosure at an earlier time. Alternatively or additionally, estimate of the harness resistance value $R_{harness}$ may include a harness resistance estimate $R_{hEst}$ determined using a different method, such as by using sensor data to measure the harness resistance value $R_{harness}$, either directly or indirectly. Alternatively or additionally, estimate of the harness resistance value $R_{harness}$ may be determined using a model of degradation as a function of time, temperature, and/or one or more other factors.

In some embodiments, determining the stimulus magnitude based on the estimate of the harness resistance value $R_{harness}$ includes determining a maximum stimulus magnitude to maintain a bridge voltage of the input power supply above a predetermined value. The predetermined value may include, for example, a voltage level required to maintain the processor 102 and/or other circuitry in an operational condition.

In some embodiments, determining the stimulus magnitude based on the estimate of the harness resistance value $R_{harness}$ includes determining a maximum stimulus magnitude based on an approximation of a battery voltage of the input power supply. For example, the maximum stimulus magnitude may be determined to cause the battery voltage $V_{Batt}$ of the battery 70 to be maintained above a predetermined minimum battery voltage. The predetermined minimum battery voltage may be determined for maintaining the health of the battery 70 and/or to ensure that one or more other systems and/or devices supplied by the battery 70 do not experience an interruption in power from the battery 70.

At step 504, The second method 500, using the input power supply, the stimulus signal to the motor. For example in some embodiments, the processor 102 may cause an inverter to apply the stimulus signal as a d-axis voltage to the motor 19. The motor 19 may include a motor in an EPS system and/or a SbW system.

At step 506, The second method 500 measures a response to the stimulus signal. For example, the input voltage may be measured on a power input of the controller 16 where the controller 16 receives power from the vehicle power supply 10 via the wiring harness 12, while the sinusoidal stimulus signal is applied to the motor 19. Alternatively or additionally, the input voltage may include a bridge voltage of a DC bridge which supplies DC power to an inverter providing AC power to the motor 19.

At step 508, The second method 500 calculates, based on the response to the stimulus signal, a metric indicative of a status of the input power supply. The status of the input power supply, may include the status of the power supplied from the vehicle power supply 10 to the controller 16 via the wiring harness 12. For example, the processor 102 may measure a sag in the input voltage resulting from the application of electric power to the motor 19, and multiply an amount of that sag by a predetermined constant to calculate the response metric. In some embodiments, the response metric may be proportional to an estimated resistance on the power supply to the controller 16. The estimated resistance may include a resistance in the wiring harness 12. In some embodiments, the response metric may not be proportional to an estimated resistance on the power supply to the controller 16.

At step 510, The second method 500 determines a degraded condition of the input power supply based on the metric indicative of the status of the input power supply. For example, the processor 102 may compare the metric indicative of the status of the input power supply with a baseline value to determine if the metric is indicative of a degraded condition of the input power supply. In some embodiments, the condition of the input power supply may include a harness resistance value At step 512, The second method 500 performs an action in response to determining a degraded condition of the input power supply. For example, the processor 102 may take an action in response to determining the degraded condition of the input power supply. The action may depend on a value or values of the metric. The action may include, for example, generating a diagnostic trouble code (DTC), limiting output power of the motor 19, communicating a message to the remote ECU 106, and/or notifying an operator of the vehicle. Generating the DTC may include storing the DTC the memory 105 of the controller 16 and/or in a memory of one or more remote ECUs 106, such as a powertrain control module (PCM).

In some embodiments, a method for diagnosing an input power supply providing power to a motor includes: generating a sinusoidal stimulus signal; applying, using the input power supply, the sinusoidal stimulus signal to the motor; measuring a response to the sinusoidal stimulus signal; determining a degraded condition of the input power supply based on the response to the sinusoidal stimulus signal; and performing an action in response to determining the degraded condition of the input power supply.

In some embodiments, the sinusoidal stimulus signal is a non-torque producing voltage that causes the motor to produce zero net torque.

In some embodiments, applying the sinusoidal stimulus signal to the motor includes switching, by an inverter, a DC power having a bridge voltage, and wherein the response to the sinusoidal stimulus signal includes a sinusoidal voltage component of the bridge voltage.

In some embodiments, the sinusoidal stimulus signal has a stimulus frequency and the sinusoidal voltage component of the bridge voltage has a response frequency equal to twice the stimulus frequency.

In some embodiments, generating the sinusoidal stimulus signal includes generating a discretized sinusoidal stimulus signal approximating a sinusoid.

In some embodiments, generating the discretized sinusoidal stimulus signal includes generating a discretized periodic ramp signal, and determining the discretized sinusoidal stimulus signal based on the discretized periodic ramp signal.

In some embodiments, generating the discretized sinusoidal stimulus signal includes determining a value using a term to compensate for jitter introduced by an inconsistency in timing to perform at least one calculation.

In some embodiments, determining the degraded condition of the input power supply includes estimating a harness resistance value using a statistical model.

In some embodiments, estimating the harness resistance value using the statistical model includes computing a harness resistance estimate based on a magnitude of the response to the sinusoidal stimulus signal and an average of the response to the sinusoidal stimulus signal.

In some embodiments, a method for diagnosing an input power supply providing power to a motor includes: generating a stimulus signal having a stimulus magnitude; applying, using the input power supply, the stimulus signal to the motor; measuring a response to the stimulus signal; determining a degraded condition of the input power supply based on the response to the stimulus signal; and performing an action in response to determining the degraded condition of the input power supply. In some embodiments, the degraded condition of the input power supply includes a harness resistance value. In some embodiments, generating the stimulus signal includes determining the stimulus magnitude based on an estimate of the harness resistance value.

In some embodiments, the stimulus signal includes a sinusoidal stimulus signal.

In some embodiments, determining the stimulus magnitude based on the estimate of the harness resistance value includes determining a maximum stimulus magnitude to maintain a bridge voltage of the input power supply above a predetermined value.

In some embodiments, determining the stimulus magnitude based on the estimate of the harness resistance value further includes determining a maximum stimulus magnitude based on an approximation of a battery voltage of the input power supply.

In some embodiments, a system for diagnosing an input power supply providing power to a motor includes a processor and a memory including instructions. When executed by the processor, the instructions cause the processor to: generate a sinusoidal stimulus signal; apply, using the input power supply, the sinusoidal stimulus signal to the motor; measure a response to the sinusoidal stimulus signal; determine a degraded condition of the input power supply based on the response to the sinusoidal stimulus signal; and perform an action in response to determining a degraded condition of the input power supply.

In some embodiments, the sinusoidal stimulus signal is a non-torque producing voltage that causes the motor to produce zero net torque.

In some embodiments, applying the sinusoidal stimulus signal to the motor includes the instructions causing the processor to cause an inverter to switch a DC power having a bridge voltage, and wherein the response to the sinusoidal stimulus signal includes a sinusoidal voltage component of the bridge voltage.

In some embodiments, the sinusoidal stimulus signal has a stimulus frequency and the sinusoidal voltage component of the bridge voltage has a response frequency equal to twice the stimulus frequency.

In some embodiments, generating the sinusoidal stimulus signal includes generating a discretized sinusoidal stimulus signal approximating a sinusoid.

In some embodiments, generating the discretized sinusoidal stimulus signal includes generating a discretized periodic ramp signal, and determining the discretized sinusoidal stimulus signal based on the discretized periodic ramp signal.

In some embodiments, generating the discretized sinusoidal stimulus signal includes determining a value using a term to compensate for jitter introduced by an inconsistency in timing of calculations.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

What is claimed is:

1. A method for diagnosing an input power supply providing power to a motor, the method comprising:
   generating a sinusoidal stimulus signal;
   applying, using the input power supply, the sinusoidal stimulus signal to the motor;
   measuring a response to the sinusoidal stimulus signal;
   calculating, based on the response to the sinusoidal stimulus signal, a metric indicative of a status of the input power supply;
   determining a degraded condition of the input power supply based on the response to the sinusoidal stimulus signal; and
   performing an action in response to determining the degraded condition of the input power supply.

2. The method of claim 1, wherein the sinusoidal stimulus signal is a non-torque producing voltage that causes the motor to produce zero net torque.

3. The method of claim 1, wherein applying the sinusoidal stimulus signal to the motor includes switching, by an inverter, a DC power having a bridge voltage, and wherein the response to the sinusoidal stimulus signal includes a sinusoidal voltage component of the bridge voltage.

4. The method of claim 3, wherein the sinusoidal stimulus signal has a stimulus frequency and the sinusoidal voltage component of the bridge voltage has a response frequency equal to twice the stimulus frequency.

5. The method of claim 1, wherein generating the sinusoidal stimulus signal includes generating a discretized sinusoidal stimulus signal approximating a sinusoid.

6. The method of claim 5, wherein generating the discretized sinusoidal stimulus signal includes generating a discretized periodic ramp signal, and determining the discretized sinusoidal stimulus signal based on the discretized periodic ramp signal.

7. The method of claim 5, wherein generating the discretized sinusoidal stimulus signal includes determining a value using a term to compensate for jitter introduced by an inconsistency in timing to perform at least one calculation.

8. The method of claim 1, wherein determining the degraded condition of the input power supply includes estimating a harness resistance value using a statistical model.

9. The method of claim 8, wherein estimating the harness resistance value using the statistical model includes computing a harness resistance estimate based on a magnitude of the response to the sinusoidal stimulus signal and an average of the response to the sinusoidal stimulus signal.

10. A method for diagnosing an input power supply providing power to a motor, the method comprising:
generating a stimulus signal having a stimulus magnitude;
applying, using the input power supply, the stimulus signal to the motor;
measuring a response to the stimulus signal;
determining a degraded condition of the input power supply based on the response to the stimulus signal; and
performing an action in response to determining a degraded condition of the input power supply,
wherein the degraded condition of the input power supply includes a harness resistance value, and
wherein generating the stimulus signal includes determining the stimulus magnitude based on an estimate of the harness resistance value.

11. The method of claim 10, wherein the stimulus signal includes a sinusoidal stimulus signal.

12. The method of claim 10, wherein determining the stimulus magnitude based on the estimate of the harness resistance value includes determining a maximum stimulus magnitude to maintain a bridge voltage of the input power supply above a predetermined value.

13. The method of claim 10, wherein determining the stimulus magnitude based on the estimate of the harness resistance value further includes determining a maximum stimulus magnitude based on an approximation of a battery voltage of the input power supply.

14. A system for diagnosing an input power supply providing power to a motor, the system comprising:
a processor and a memory including instructions that, when executed by the processor, cause the processor to:
generate a sinusoidal stimulus signal;
apply, using the input power supply, the sinusoidal stimulus signal to the motor;
measure a response to the sinusoidal stimulus signal;
determine a degraded condition of the input power supply based on the response to the sinusoidal stimulus signal; and
perform an action in response to determining the degraded condition of the input power supply.

15. The system of claim 14, wherein the sinusoidal stimulus signal is a non-torque producing voltage that causes the motor to produce zero net torque.

16. The system of claim 14, wherein applying the sinusoidal stimulus signal to the motor includes the instructions causing the processor to cause an inverter to switch a DC power having a bridge voltage, and wherein the response to the sinusoidal stimulus signal includes a sinusoidal voltage component of the bridge voltage.

17. The system of claim 16, wherein the sinusoidal stimulus signal has a stimulus frequency and the sinusoidal voltage component of the bridge voltage has a response frequency equal to twice the stimulus frequency.

18. The system of claim 14, wherein generating the sinusoidal stimulus signal includes generating a discretized sinusoidal stimulus signal approximating a sinusoid.

19. The system of claim 18, wherein generating the discretized sinusoidal stimulus signal includes generating a discretized periodic ramp signal, and determining the discretized sinusoidal stimulus signal based on the discretized periodic ramp signal.

20. The system of claim 18, wherein generating the discretized sinusoidal stimulus signal includes determining a value using a term to compensate for jitter introduced by an inconsistency in timing of calculations.

* * * * *